United States Patent
Nakanishi et al.

(10) Patent No.: US 6,525,934 B1
(45) Date of Patent: Feb. 25, 2003

(54) THERMAL CONTROLLER FOR COMPUTER, THERMAL CONTROL METHOD FOR COMPUTER AND COMPUTER EQUIPPED WITH THERMAL CONTROLLER

(75) Inventors: Tohru Nakanishi, Moriyama (JP); Toshihiko Nishiio, Moriyama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/537,991

(22) Filed: Mar. 29, 2000

(30) Foreign Application Priority Data

Apr. 15, 1999 (JP) .......................................... 11-107635

(51) Int. Cl.$^7$ ................................................ H05K 7/20
(52) U.S. Cl. ...................... 361/687; 361/683; 361/700; 165/104.33; 174/16.3
(58) Field of Search ................................ 361/700, 704, 361/709, 760, 687, 695, 699, 701, 706, 717, 718–719; 165/122, 126, 104.32, 104.33, 121, 165, 80.3, 80.4; 415/177–178; 364/708.01, 708.02; 257/718–719, 722; 62/3.2, 259.2; 174/15.2

(56) References Cited

U.S. PATENT DOCUMENTS

| | | | | |
|---|---|---|---|---|
| 5,313,362 A | * | 5/1994 | Hatada et al. | 361/709 |
| 5,569,950 A | * | 10/1996 | Lewis et al. | 257/467 |
| 5,805,417 A | * | 9/1998 | Nakagawa et al. | 361/687 |
| 5,815,371 A | * | 9/1998 | Jeffries et al. | 361/704 |
| 5,887,435 A | * | 3/1999 | Morton | 62/3.6 |
| 5,987,890 A | * | 11/1999 | Chiu et al. | 62/3.2 |
| 6,047,766 A | * | 4/2000 | Van Brocklin et al. | 165/104.26 |
| 6,111,748 A | * | 8/2000 | Bhatia | 361/695 |
| 6,173,576 B1 | * | 1/2001 | Ishida et al. | 62/3.7 |
| 6,282,089 B1 | * | 8/2001 | Nakanishi et al. | 361/687 |
| 6,351,382 B1 | * | 2/2002 | Nakanishi et al. | 361/700 |

FOREIGN PATENT DOCUMENTS

| | | |
|---|---|---|
| JP | 61-61894 | 4/1986 |
| JP | 63-211798 | 9/1988 |
| JP | 2-87597 | 3/1990 |
| JP | 3-57989 | 6/1991 |
| JP | 08236972 | 9/1996 |
| JP | 09199882 | 7/1997 |
| JP | 11017373 | 1/1999 |

* cited by examiner

Primary Examiner—Darren Schuberg
Assistant Examiner—Michael Datskovsky
(74) Attorney, Agent, or Firm—Bracewell and Patterson

(57) ABSTRACT

A thermal controller and thermal control method for a computer and computer equipped with a thermal controller is disclosed which avoids giving an uncomfortable feeling to the user due to heat generated within a personal computer. A thermal controller for a computer includes a heat pipe for moving heat generated by an MPU within a computer to the vicinity of a top face and a bottom face of a main body, two heat radiating means for releasing heat in the vicinity of the top face and the bottom face, and a volume switch for adjusting a quantity of heat absorbed from a heat spreader by a Peltier device.

11 Claims, 9 Drawing Sheets

THERMAL CONTROLLER FOR COMPUTER, THERMAL CONTROL METHOD FOR COMPUTER AND COMPUTER EQUIPPED WITH THERMAL CONTROLLER

BACKGROUND OF THE INVENTION

1. Technical Field

The present invention relates to a thermal controller for a computer, a thermal control method for a computer, and a computer equipped with a thermal controller in which heat generated by a substrate and the like of a computer is moved to a predetermined portion.

2. Description of the Related Art

Notebook personal computers have been conventionally used. Wearable personal computers are also used these days. These mobile personal computers are used in various environments, and specifically, they are used on desks and are occasionally used on the user's body, for example, on the user's lap. When using such a mobile personal computer on the user's body, the user can feel heat. It can sometimes feel uncomfortable.

Furthermore, the users of conventional notebook personal computers have actually complained about the following: when computer is used on his/her lap, his/her lap becomes very hot; when a PC card is removed immediately after use, the card is too hot to hold; and the keyboard is uncomfortably warm. For example, in a notebook personal computer 1 of FIG. 9, an MPU (microprocessor unit) 2 and a PC card 3 particularly generate a large amount of heat. The users sometimes feel the heat mainly from these parts.

SUMMARY OF THE INVENTION

An object of the present invention is to control the quantity of heat generated within a mobile personal computer so as not to give an uncomfortable feeling to the user.

Another object of the present invention is to control the direction of movement of heat from inside of a personal computer so as not to give an uncomfortable feeling to the user.

In the thermal controller for a computer, the thermal control method for a computer and the computer is equipped with a thermal controller according to the present invention, heat generated from a predetermined part of the computer is distributed to a plurality of predetermined positions.

Also, in the thermal controller for a computer, the thermal control method for a computer and the computer equipped with a thermal controller according to the present invention, quantities of heat moved to a plurality of predetermined positions are changed by control means or in a controlling step. The phrase "movement of heat " used herein means the heat conduction within an object or body or heat transfer between different objects.

Furthermore, in the thermal controller for a computer and the computer equipped with a thermal controller of the present invention, the quantity of heat absorbed from a heat radiating member by a thermomodule device is adjusted so as to change the quantities of heat to be moved to a plurality of predetermined positions. A thermomodule device used herein means a device utilizing the Peltier effect or the Thomson effect, which exhibits heat absorption in one portion and heat radiation in the other portion when an electric current is passed.

In the computer equipped with a thermal controller of the present invention, the computer is a mobile personal computer, and heat generated from a predetermined part of the computer is distributed at least to the vicinity of a top face and the vicinity of a bottom face of the main body of the computer. A mobile personal computer used herein means a notebook personal computer, a wearable personal computer and the like.

BRIEF DESCRIPTION OF THE DRAWINGS

The novel features are set forth in the appended claims. The present invention itself, however, as well as a preferred mode of use, further objectives, and advantages thereof, will best be understood by reference to the following detailed description of a preferred embodiment when read in conjunction with the accompanying drawings, wherein:

DESCRIPTION OF THE PREFERRED EMBODIMENT

Preferred embodiments of a thermal controller for a computer, a thermal control method for a computer and a computer equipped with a thermal controller according to the present invention will be described in detail with reference to the accompanying drawings.

Figure 1:
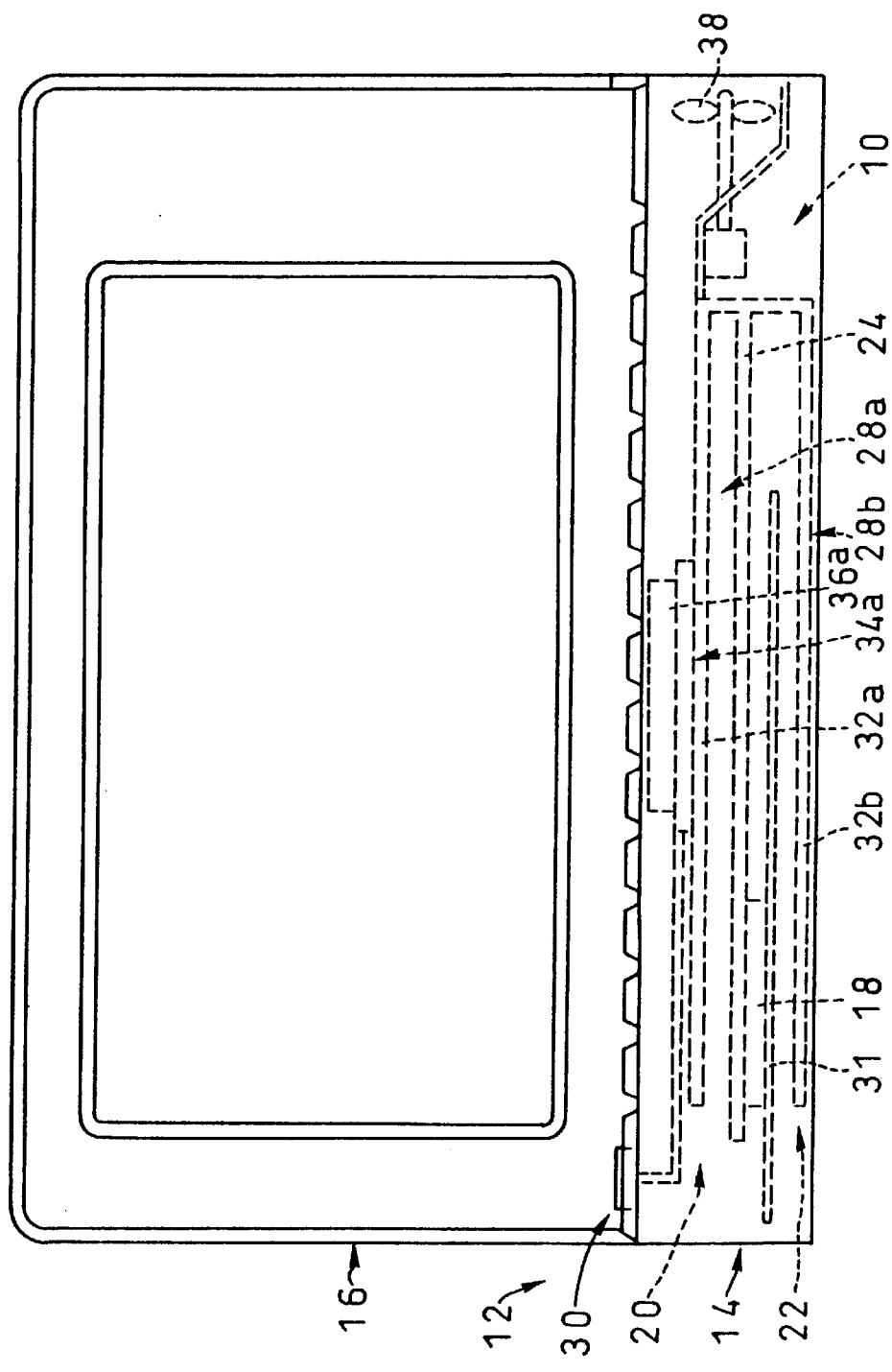
FIG. 1 is a front view showing a computer equipped with a thermal controller according to an embodiment of the present invention.
Figure 2:
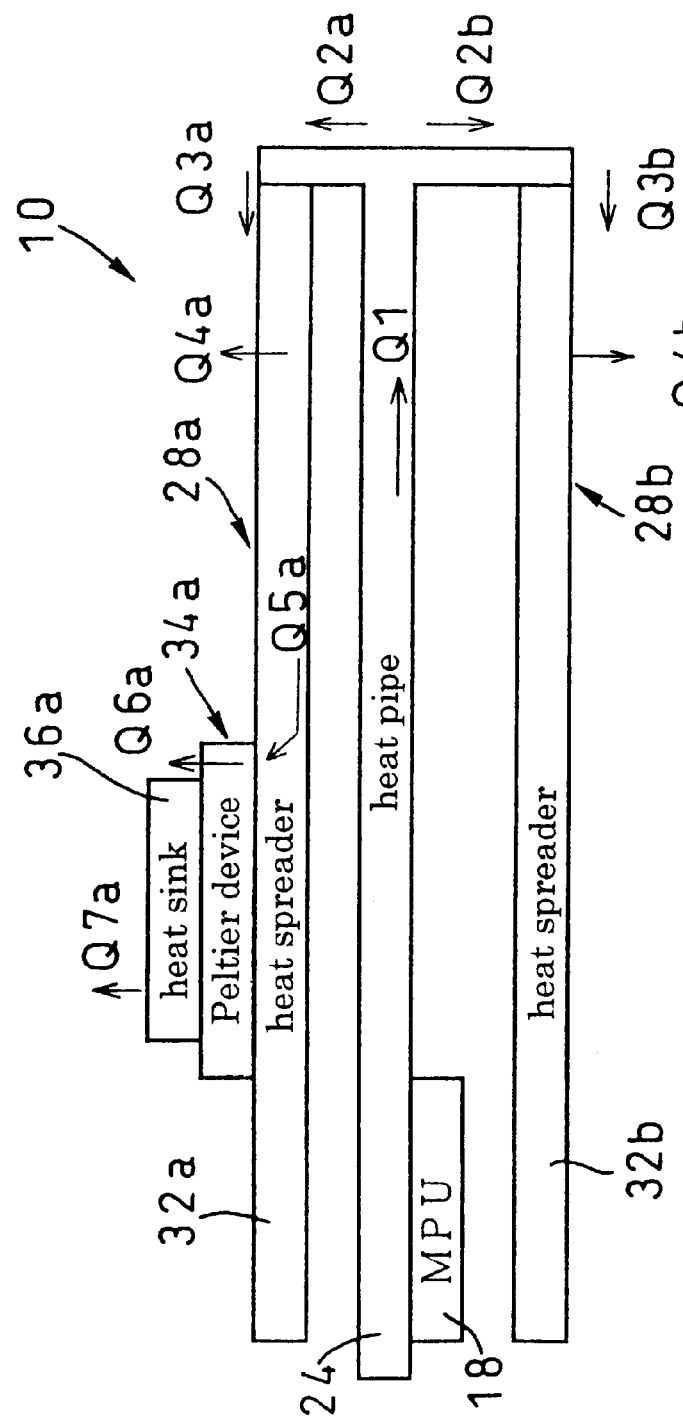
FIG. 2 is a diagram illustrating movement of heat within the thermal controller of FIG. 1.

In FIGS. 1 and 2, a reference numeral 10 denotes a thermal controller for a computer according to the present invention, and a reference numeral 12 denotes a notebook personal computer equipped with the thermal controller of the present invention. A reference numeral 14 denotes a main body of the personal computer 12 and a reference numeral 16 denotes a cover including a display screen.

The thermal controller 10 includes a heat pipe (heat conducting means) 24 for moving heat generated by an MPU 18 of the computer 12 to the vicinity of a top face 20 and the vicinity of a bottom face 22 of the main body 14, two heat radiating means 28a and 28b for releasing the heat in the vicinity of the top face 20 and the bottom face 22, and a volume switch (control means) 30 for s adjusting a quantity of heat absorbed from a heat spreader 32a by a Peltier device 34a.

The heat pipe 24 is kept in contact with the MPU 18 fixed on a substrate 31, so that heat generated by the MPU 18 can be absorbed to be distributed to the top face side 20 and the bottom face side 22 and to be moved to the two heat radiating means 28a and 28b.

The heat radiating means 28a includes the heat spreader (heat radiating member) 32a for releasing the heat moved by the heat pipe 24, the Peltier device (thermomodule device) 34a for absorbing the heat from the heat spreader 32a, and a heat sink 36a for absorbing the heat from the Peltier device 34a. The computer further includes a fan 38 for dissipating the heat released from the heat radiating means 28a and 28b to the outside of the computer 12. The heat radiating means 28b includes a heat spreader 32b. The heat spreaders 32a and 32b and the heat sink 36a can be made from a heat conductive material such as copper and aluminum.

The volume switch 30 adjusts the quantity of heat absorbed from the heat spreader 32a by the Peltier device 34a so as to adjust the quantity of heat moved from the heat pipe 24 to the heat spreader 32a. Thus, the o quantities of heat to be moved to the heat spreaders 32a and 32b can be adjusted. Specifically, when the quantity of heat absorbed from the heat spreader 32a by the Peltier device 34a is increased, the quantity of heat to be moved to the heat spreader 32a is increased while the quantity of heat to be moved to the heat spreader 32b is decreased. In contrast, when the quantity of heat absorbed from the heat spreader 32a by the Peltier device 34a is decreased, the quantity of heat to be moved to the heat spreader 32a is decreased while the quantity of heat to be moved to the heat spreader 32b is increased. As a result, the volume switch 30 functions as the control means for changing the quantities of heat to be moved to the two heat radiating means 28a and 28b.

Figure 3:
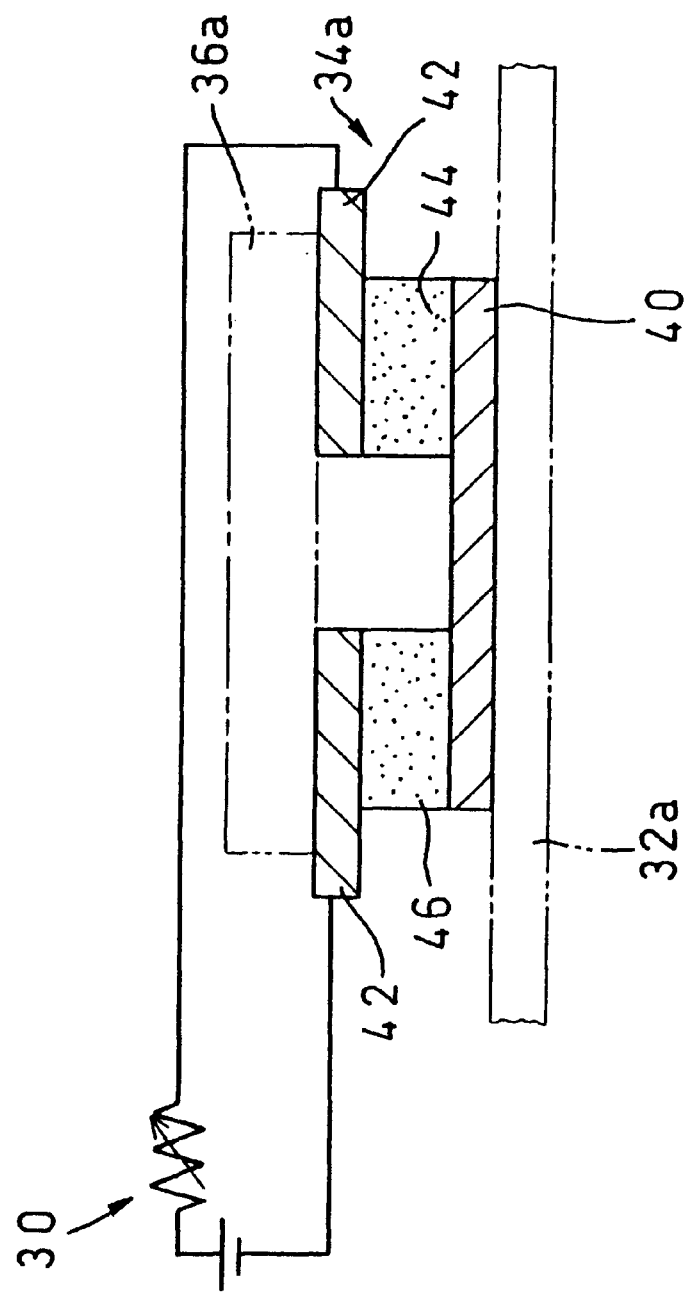
FIG. 3 is a front sectional view of a Peltier device used in the thermal controller of FIG. 1.

The Peltier device 34a includes, as is shown in FIG. 3, a metal 40 disposed on the heat-absorbing side, a metal 42 on the heat-radiating side, an n-type semiconductor 44, and a p-type semiconductor 46. When the volume switch 30 is turned on for allowing an electric current to flow through the metal 42, the metal 40 absorbs heat from the heat spreader 32a and the metal 42 releases heat to the heat sink 36. Also, when the value of the electric current flowing through the metal 42 is changed, the quantity of heat absorbed from the heat spreader 32a by the metal 40 can be changed.

The thermal control method for a computer according to the present invention will now be described through description of the operations of the thermal controller 10 and the computer 12 equipped with the thermal controller.

When the power is turned on, the personal computer 12 is activated and the MPU 18 starts processing while generating heat. When the MPU 18 is particularly operated at a high speed, a larger quantity of heat is generated by the MPU 18.

Since the heat pipe 24 is in contact with the MPU 18, heat Q1 corresponding to almost all the heat generated by the MPU 18 moves through the heat pipe 24. The heat Q1 is divided, on the basis of the energy conservation law, into heat Q2a which moves toward the heat spreader 32a and heat Q2b which moves toward the heat spreader 32b. Specifically, the heat Q1 is distributed to the vicinity of the top face 20 and the vicinity of the bottom face 22. Heat Q3a corresponding to almost all the heat Q2a moves to the heat spreader 32a, and heat Q3b corresponding to almost all the heat Q2b moves to the heat spreader 32b. Heat Q4a corresponding to a portion of the heat Q3a is radiated from the heat spreader 32a, and heat Q4b corresponding to a portion of the heat Q3b is radiated from the heat spreader 32b. A keyboard disposed on the top face of the computer 12 gets hot due to the heat Q4a, while the bottom face of the computer 12 gets hot due to the heat Q4b.

When the temperature of the bottom face of the computer 12 increased by the heat Q4b is desired to be lowered at the time of using it on the lap or the like, the volume switch 30 is turned on, and thus the Peltier device 34a is activated. When the Peltier device 34a is operated, it absorbs heat from the heat spreader 32a. Therefore, heat Q5a corresponding to a part of the heat Q3a moves toward the Peltier device 34a, and the rest of the heat Q4a is radiated to the surroundings. Since the quantity of heat Q3a is equal to the sum of the quantities of heat Q4a and Q5a, the quantity of heat Q3a is increased by the quantity of heat Q5a as compared with the case where the Peltier device 34a is not operated, and the quantity of heat Q2a is accordingly increased. In assuming that the quantity of heat Q1 is equal to the sum of the quantities of heat Q2a and Q2b and the quantity of heat Q1 is substantially constant, the quantity of heat Q2b is decreased when the quantity of heat Q2a is increased. Since the quantity of heat Q2b is decreased in this manner, the temperature of the bottom face of the computer 12 is decreased. By adjusting the value of the electric current flowing through the Peltier device 34a by using the volume switch 30, the quantity of heat Q5a can be adjusted, so that the temperature of the bottom face of the computer 12 can be adjusted.

Heat Q6a corresponding to a portion of the heat Q5a is actually moved through the Peltier device 34a to the heat sink 36a and then stored therein, from which heat Q7a corresponding to a portion of the heat Q6a is radiated. Also, the heat Q4a and Q7a are naturally conducted to the outside of the computer 12 but can be forcibly discharged by operating the fan 38.

In this manner, the heat Q1 is generally distributed toward the heat spreaders 32a and 32b under the condition that the volume switch 30 is off. When the temperature of the bottom face of the computer 12 is desired to be lowered, the volume switch 30 is turned on so as to increase the quantity of heat Q2a and decrease the quantity of heat Q2b. Thus, the uncomfortableness on the lap or the like can be suppressed. Furthermore, the value of the electric current flowing through the Peltier device 34a is adjusted by using the volume switch 30, so that the temperature of the top or bottom face of the computer 12 can be adjusted. Thus, the user can be freed from the uncomfortableness, and the user himself/herself can also select a portion for releasing the heat.

One embodiment of the present invention has been described so far, but the embodiment of the present invention is not limited to the above embodiment.

For example, another heat radiating means can be additionally provided in the side portion of the computer 12. In addition, the heat radiating means disposed in the side portion of the computer 12 can be provided with a Peltier device and a heat sink. Furthermore, the fan 38 can be constantly operated during the operation of the computer 12 but it can also be operated when the power is supplied to the Peltier device 34a. Alternatively, the timing of operating the fan 38 can be determined on the basis of the total heat quantity within the computer 12, or it can be controlled by the MPU 18.

Figure 4:
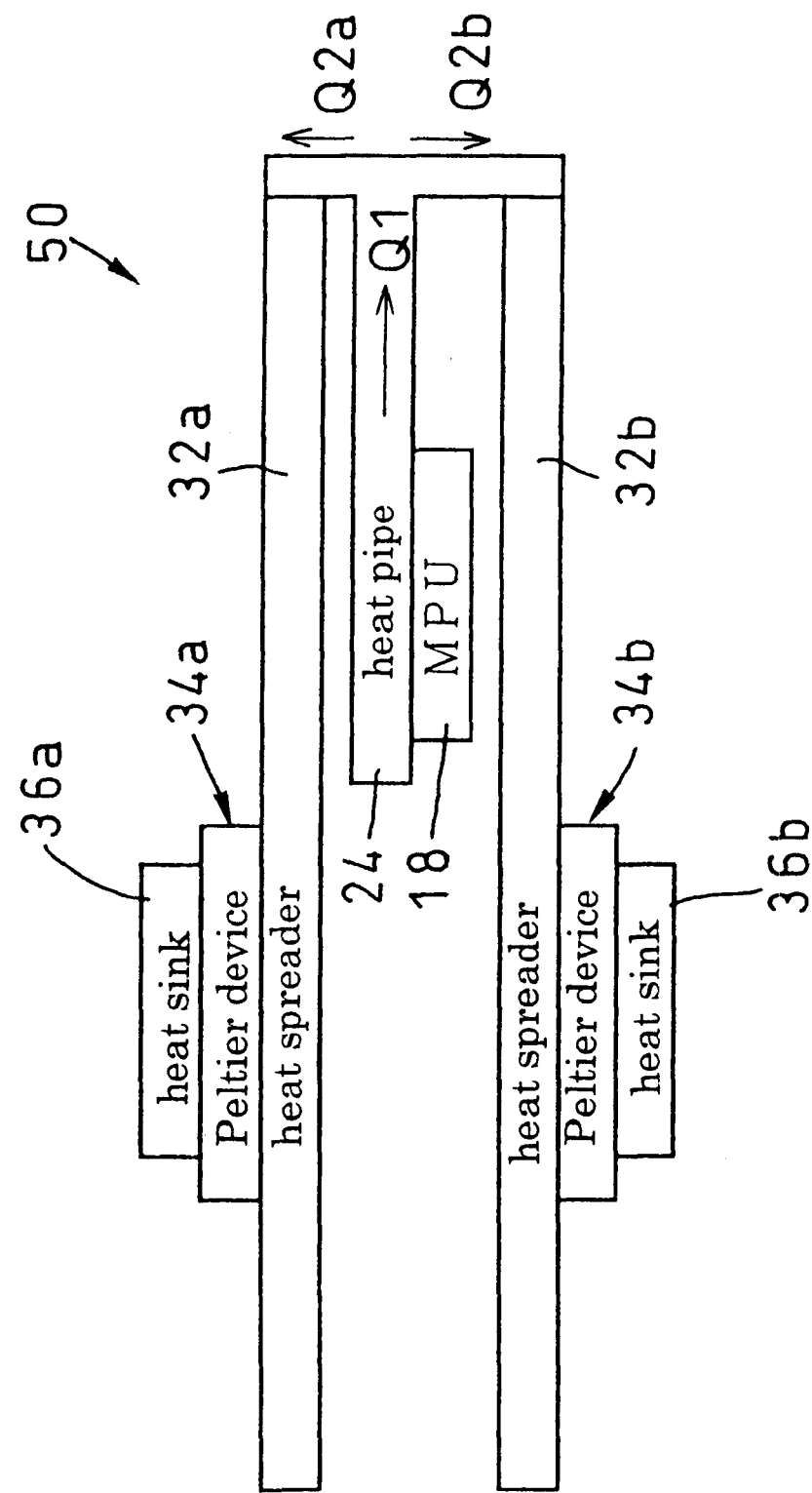
FIG. 4 is a diagram showing another embodiment of a thermal controller for a computer according to the present invention.

Alternatively, the thermal controller for a computer according to the present invention can be realized as a thermal controller 50 for a computer as shown in FIG. 4. In this thermal controller 50, a Peltier device 34b and a heat sink 36b are additionally provided to a heat spreader 32b. Further, the thermal controller 50 is provided with two volume switches (control means, not shown) corresponding to the two Peltier devices 34a and 34b, respectively. In this thermal controller 50, the quantity of heat Q2a can be increased so as to decrease the quantity of heat Q2b by absorbing heat from the heat spreader 32a by using the Peltier device 34a.

Alternatively, the quantity of heat Q2b can be increased so as to decrease the quantity of heat Q2a by absorbing heat from the heat spreader 32b by using the Peltier device 34b. Accordingly, when the computer 12 is used on a desk, the temperature of the keyboard on the top face of the computer 12 is desired to be lower than that of the bottom face, the quantity of heat to be moved toward the top face of the computer 12 can be decreased.

Figure 5:
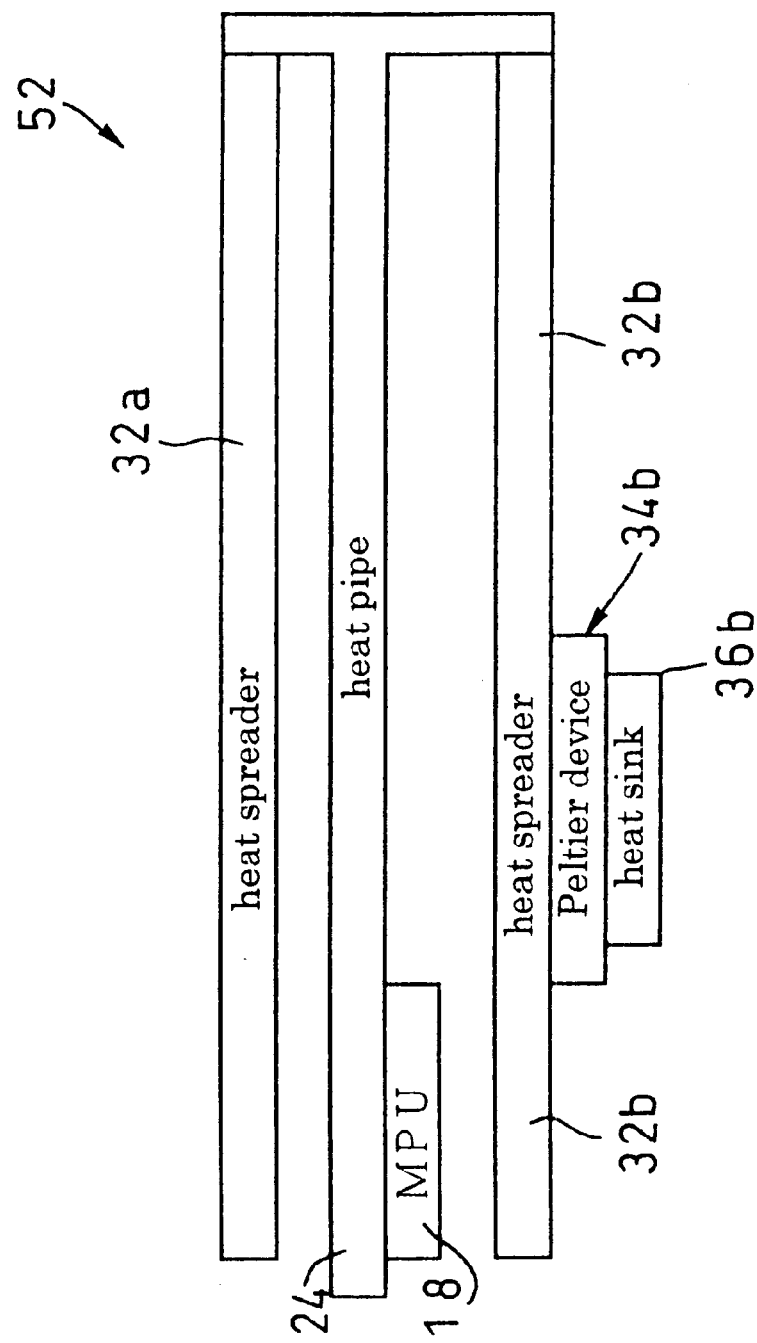
FIG. 5 is a diagram showing still another embodiment of a thermal controller for a computer according to the present invention.

Alternatively, the thermal controller of the present invention can be realized as a thermal controller 52 for a computer as is shown in FIG. 5. In this thermal controller 52, a Peltier device 34b and a heat sink 36b are provided only to a heat spreader 32b. The thermal. controller 52 is preferably used when the temperature of the keyboard on the top face is lowered as compared with the temperature of the bottom face of the computer 12.

Figure 6:
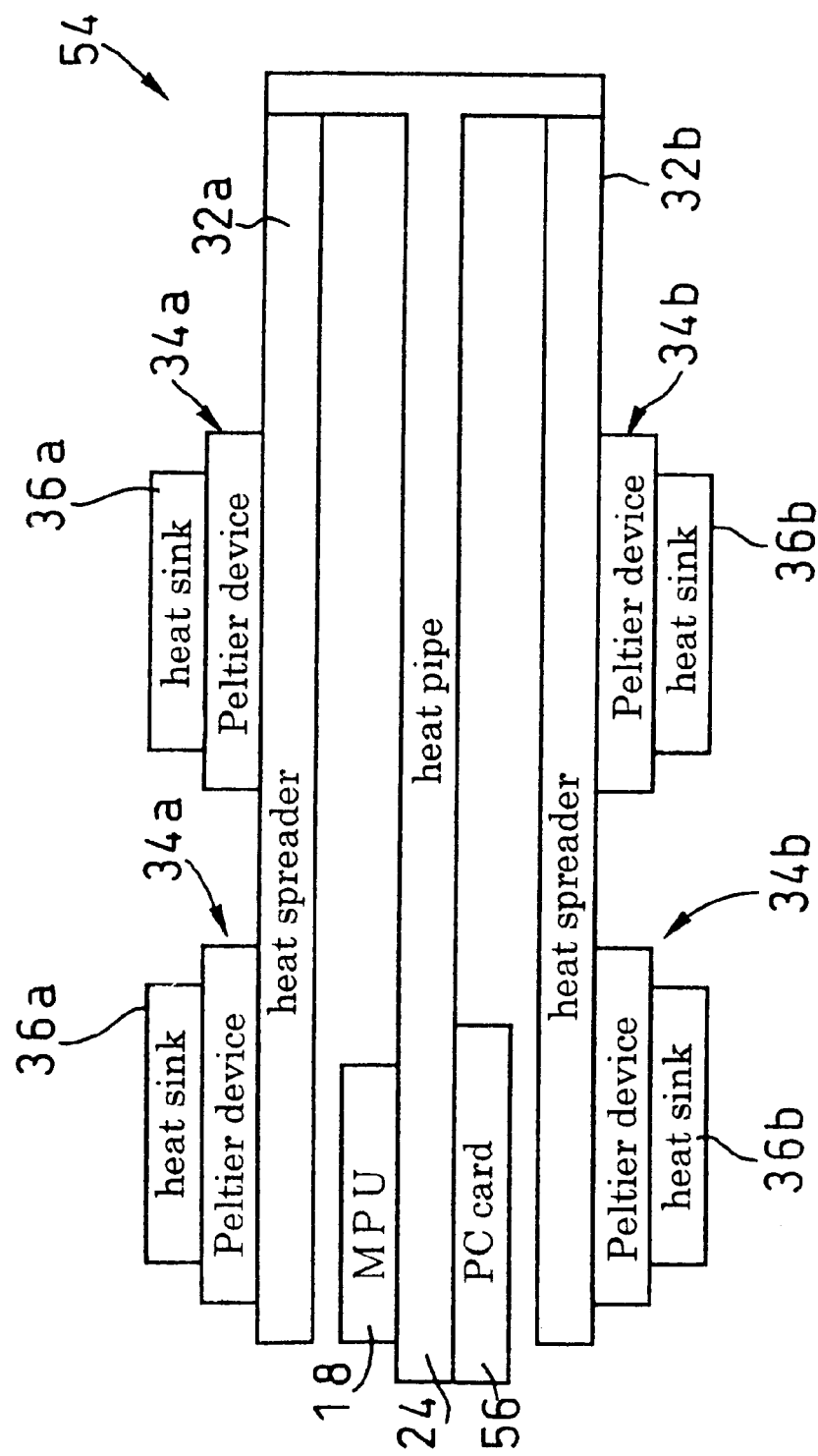
FIG. 6 is a diagram showing a further embodiment of a thermal controller for a computer according to the present invention.

Alternatively, the thermal controller of the present invention can be realized as a thermal controller 54 for a computer as is shown in FIG. 6. In this thermal controller 54, two Peltier devices 34a and two heat sinks 36a are provided to a heat spreader 32a, and two Peltier devices 34b and two heat sinks 36b are provided to a heat spreader 32b. The thermal controller 54 is further provided with four volume switches (control means, not shown) corresponded to the four Peltier devices 34a and 34b, respectively. Further, in the thermal controller 54, heat of a PC card 56 can also be absorbed by a heat pipe 24. In this thermal controller 54, temperatures can be increased or decreased in selected locations of the top face and bottom face of the computer 12.

Figure 7:
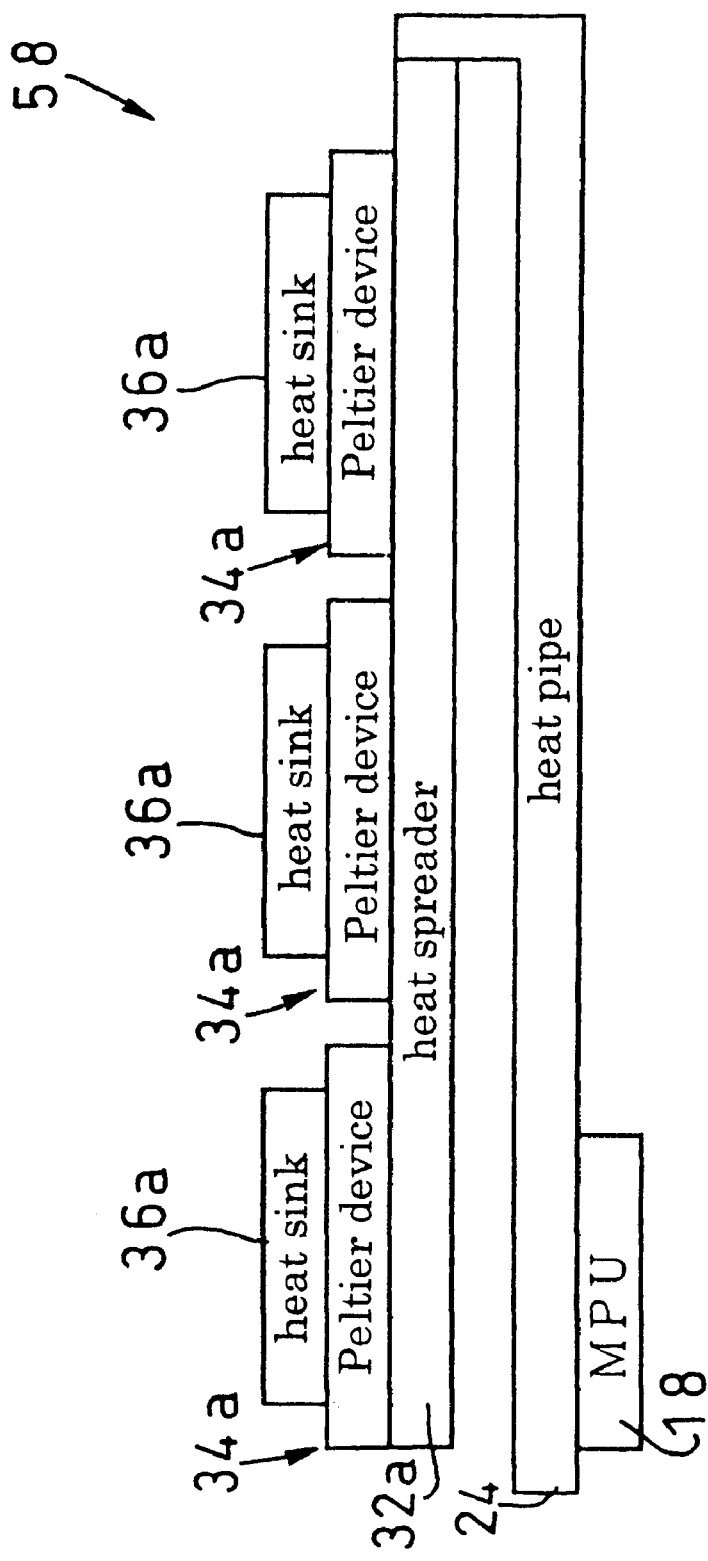
FIG. 7 is a diagram showing still further embodiment of a thermal controller for a computer according to the present invention.

Alternatively, the thermal controller of the present invention can be realized as a thermal controller 58 for a computer as shown in FIG. 7. In this thermal controller 58, a heat spreader 32a is provided only to the top face of the computer 12, so that heat generated by the MPU 18 can be moved only toward the top face of the computer 12. The thermal controller 58 also includes three Peltier devices 34a and three heat sinks 36a. In this thermal controller 58, temperatures can be increased or decreased in the selected parts of the entire top face of the computer 12.

Figure 8:
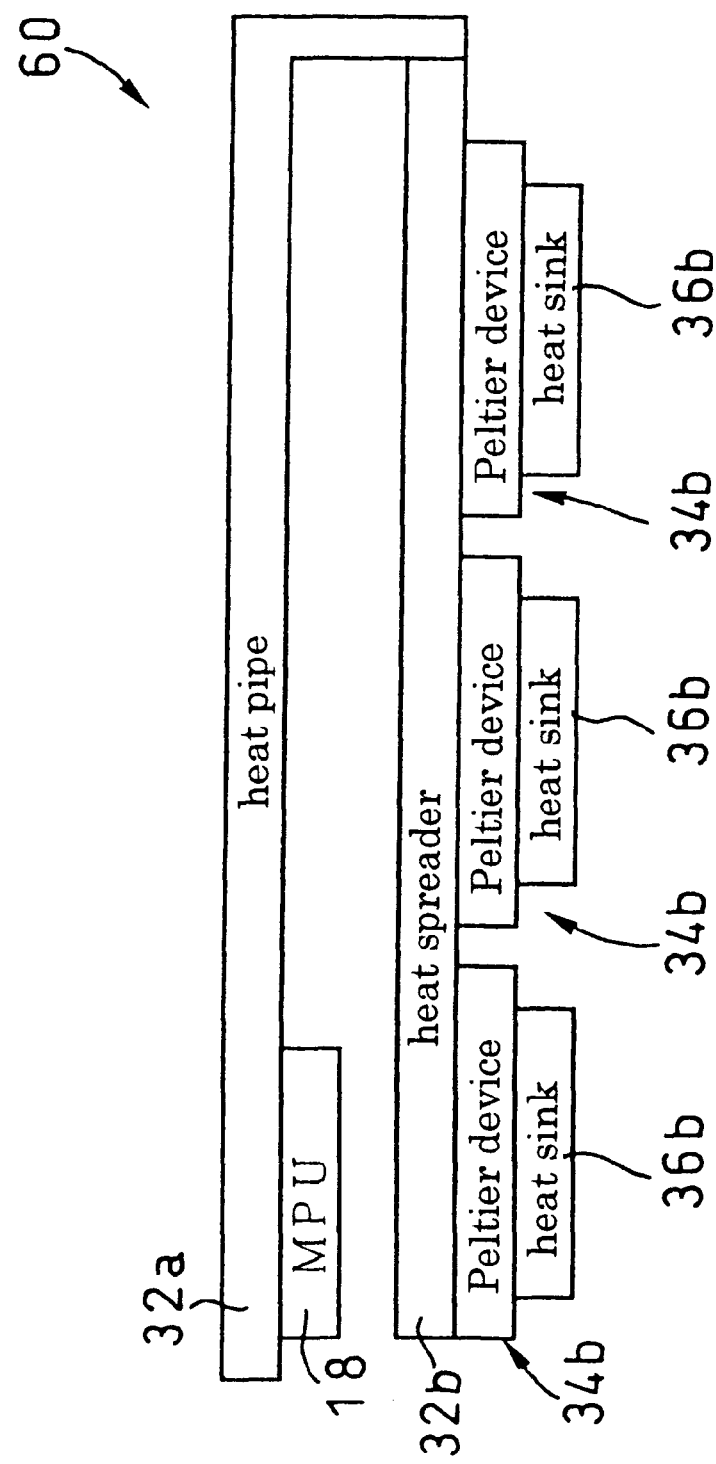
FIG. 8 is a diagram showing another embodiment of a thermal controller for a computer according to the present invention.
Figure 9:
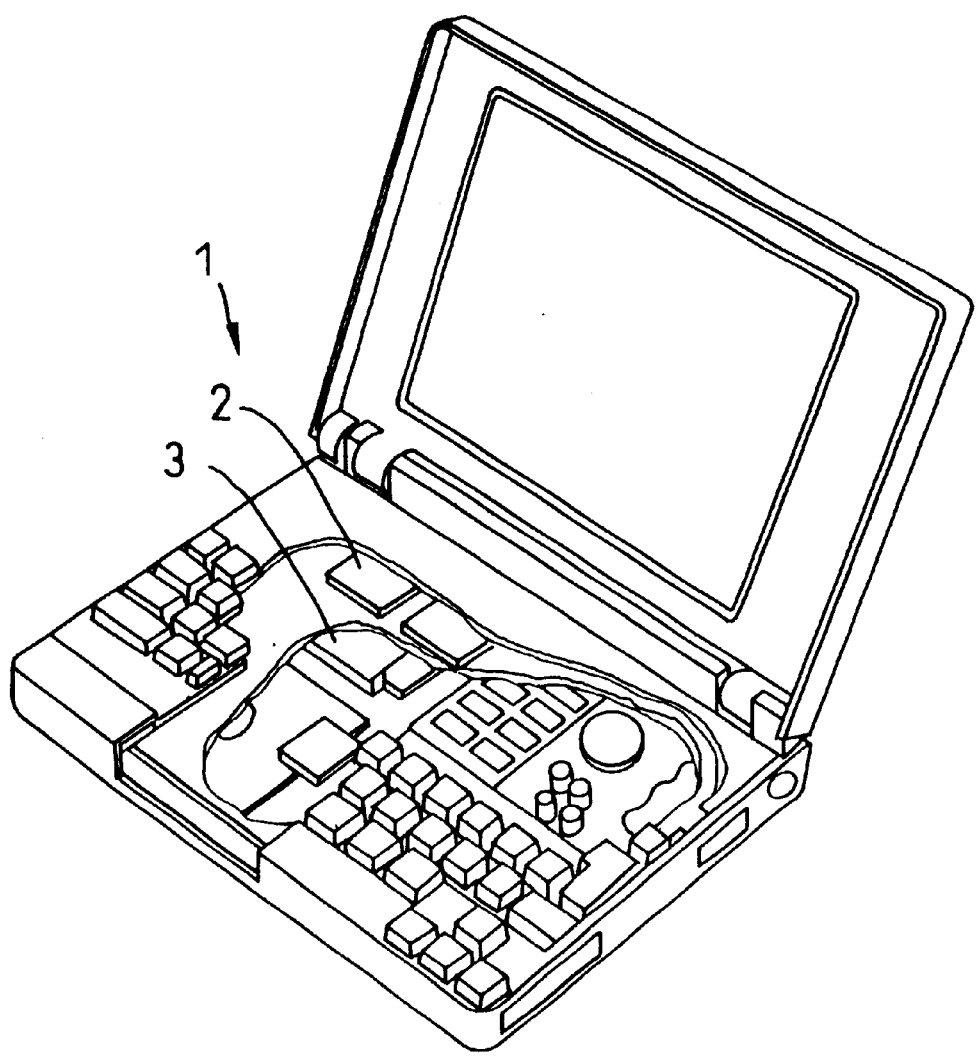
FIG. 9 is a perspective view of a conventional notebook personal computer.

Alternatively, the thermal controller of the present invention can be realized as a thermal controller 60 for a computer as shown in FIG. 8. In this thermal controller 60, a heat spreader 32b is provided only to the bottom face of the computer 12, so that heat generated by the MPU 18 can be moved only toward the bottom face of the computer 12. The thermal controller 60 further includes three Peltier devices 34b and three heat sinks 36b. In the thermal controller 60, temperatures can be increased or decreased in selected parts of the entire bottom face of the computer 12.

The preferred embodiments of the present invention have been described with reference to the accompanying drawings, but the present invention is not limited to those shown in the drawings.

For example, the thermal controller for a computer and the thermal control method for a computer according to the present invention are applicable to any computer other than a mobile computer. Also, the part from which heat is absorbed by the present thermal controller is not limited to the MPU or the PC card but can be any part or member within a computer. Furthermore, the structure, shape and dimension of the Peltier device used as a thermomodule device are arbitrary. Moreover, a plurality of heat pipes can be provided so that the heat generated by the MPU and the like can be moved toward a plurality of heat radiating means through a plurality of heat pipes. For example, heat generated by the MPU and the like can be temporarily moved toward a front side and a back side of the computer through a plurality of heat pipes, and the moved heat can be released through heat radiating means disposed in the vicinity of the top face and the bottom face on the front side of the computer and another heat radiating means disposed in the vicinity of the top face and bottom face on the back side. Moreover, the materials for the heat sink and the heat spreader are not particularly limited, as far as they have good heat absorption and heat radiation, like copper and aluminum.

In addition, it will be apparent to those skilled in the art various changes, modifications and improvements can be made thereto without departing from the spirit or scope of the present invention. Also, arrangements attained by substituting one or more specific parts which can achieve the same function or effect should be considered to be within the scope of the present invention.

According to the present invention, heat generated from a predetermined part of a computer can be distributed to a plurality of predetermined positions. For example, the heat can be distributed to a top face and a bottom face of the computer. Accordingly, the heat generated within the computer can be prevented from being concentrated in one portion.

According to the present invention, the user himself/herself can select or adjust the quantities of heat to be moved to the respective heat radiating means. For example, when a notebook personal computer, to which the present invention is applied, is used on a desk, the quantity of heat to be released from the bottom face is maximized, so that the quantity of heat to be released through the keyboard can be minimized. In contrast, when it is used on the lap, the quantity of heat to be released through the bottom face can be decreased. Alternatively, when the present invention is applied to a wearable personal computer, the quantity of heat to be released through the sides of the computer can be increased, so as to avoid giving a uncomfortable feeling to the user.

Moreover, by using a thermomodule device, the thermal controller of the present invention can be made compact. For example, even when one Peltier device with a dimension of approximately 1 cm×1 cm×3 mm is used as the thermomodule device, the effect of the present invention can be achieved. Therefore, the present invention does not increase the size of a currently used notebook personal computer. In addition, some Peltier devices cost only several hundred yen each, and hence, the present invention does not increase the manufacturing cost of computers. Although power consumption is increased due to the Peltier device, there is no need to constantly supply power to the Peltier device by disposing the Peltier device away from a heat generating component and by moving heat generated from the component to a heat spreader or the like for absorption. Unlike in a conventional technique, since there is no need to constantly supply power to the Peltier device and, in addition, the user himself/herself can selectively supply power to the Peltier device, the increase in cost can be prevented.

While the present invention has been particularly shown and described with respect to preferred embodiments thereof, it should be understood by those skilled in the art that the foregoing and other changes in form and detail may be made therein without departing from the spirit and scope of the invention as defined in the appended claims.

What is claimed is:

1. A thermal controller for a computer, comprising:

heat conducting means for moving heat generated from a predetermined part of said computer to a plurality of predetermined positions;

a plurality of heat radiating means for releasing heat at said plurality of predetermined positions;

a fan for discharging, from said computer, heat released from said heat radiating means; and control means for selectively controlling the dissipation of heat at each of said plurality of heat radiating means wherein the amount of heat dissipated at each of said plurality of heat radiating means can be individually controlled.

2. The thermal controller for a computer according to claim 1, wherein said control means includes a peltier device.

3. A thermal controller for a computer, comprising:

heat conducting means for moving heat generated from a predetermined part of said computer to a plurality of predetermined positions; and a plurality of heat radiating means for releasing heat at said plurality of predetermined positions, wherein at least one of said plurality of heat radiating means includes a heat radiating member thermally coupled with said heat conducting means and controllable heat sink means for absorbing heat from said heat radiating member; and control means for selectively controlling the dissipation of heat at each of said plurality of heat radiating means wherein the amount of heat dissipated at each of said plurality of heat radiating means can be individually controlled.

4. The controller according to claim 3, further comprising a fan for discharging, from said computer, heat released from said heat radiating means.

5. The thermal controller for a computer according to claim 3, wherein said controllable heat sink means includes a thermomodule device for absorbing heat from said heat radiating member, and a heat sink for absorbing heat from said thermomodule device.

6. The thermal controller for a computer according to claim 5, wherein said control means includes a peltier device.

7. A mobile personal computer equipped with a thermal controller, said thermal controller comprising:

one or more heat conducting means for moving heat generated from a predetermined part of said mobile personal computer to a plurality of predetermined positions;

a plurality of heat radiating means for releasing heat from said plurality of predetermined positions, wherein at least one of said heat radiating means is disposed in the vicinity of a top face of a main body of said mobile personal computer and another heat radiating means is disposed in the vicinity of a bottom face of said mobile personal computer; and control means for selectively controlling the dissipation of heat at each of said plurality of heat radiating means wherein the amount of heat dissipated at each of said plurality of heat radiating means can be individually controlled.

8. The computer equipped with a thermal controller according to claim 7, wherein said control means includes a peltier device.

9. A computer equipped with a thermal controller, said thermal controller comprising:

heat conducting means for moving heat generated from a predetermined part of said computer to a plurality of predetermined positions; and a plurality of heat radiating means for releasing heat from said plurality of predetermined positions, wherein at least one of said heat radiating means includes a heat radiating member thermally coupled with said heat conducting means and controllable heat sink means for absorbing heat from said heat radiating member, and control means for selectively controlling the dissipation of heat at each of each plurality of heat radiating means wherein the amount of heat dissipated at each of said plurality can be individually controlled.

10. The computer equipped with a thermal controller according to claim 9, wherein said controllable heat sink means includes a thermomodule device for absorbing heat from said heat radiating member, and a heat sink for absorbing heat from said thermomodule device.

11. The computer equipped with a thermal controller according to claim 10, wherein said computer is a mobile personal computer.

* * * * *